(12) United States Patent
Favill

(10) Patent No.: US 12,740,019 B2
(45) Date of Patent: Sep. 15, 2026

(54) DATA CENTER

(71) Applicant: Pripco Limited, Cheltenham (GB)

(72) Inventor: Aaron Favill, Leamington Spa (GB)

(73) Assignee: Pripco Limited, Cheltenham (GB)

( * ) Notice: Subject to any disclaimer, the term of this patent is extended or adjusted under 35 U.S.C. 154(b) by 0 days.

(21) Appl. No.: 19/132,099

(22) PCT Filed: Nov. 24, 2023

(86) PCT No.: PCT/GB2023/053070

§ 371 (c)(1),
(2) Date: May 22, 2025

(87) PCT Pub. No.: WO2024/110765

PCT Pub. Date: May 30, 2024

(65) Prior Publication Data

US 2026/0006757 A1 Jan. 1, 2026

(30) Foreign Application Priority Data

Nov. 25, 2022 (GB) ..................................... 2217691

(51) Int. Cl.
*H05K 7/20* (2006.01)
*H05K 7/14* (2006.01)

(52) U.S. Cl.
CPC ....... *H05K 7/20745* (2013.01); *H05K 7/1497* (2013.01); *H05K 7/20145* (2013.01); *H05K 7/20754* (2013.01)

(58) Field of Classification Search
CPC ............. H05K 7/1497; H05K 7/20745; H05K 7/20145; H05K 7/1488; H05K 7/20;
(Continued)

(56) References Cited

U.S. PATENT DOCUMENTS 8,943,757 B2 * 2/2015 Parizeau ............. H05K 7/1497 52/173.1
10,485,142 B2 11/2019 Rogers
(Continued)

FOREIGN PATENT DOCUMENTS

AU 2014/202253 A1 5/2014
CA 2 904 518 A1 12/2015
(Continued)

*Primary Examiner* — Michael A Matey
(74) *Attorney, Agent, or Firm* — Christensen, Fonder, Dardi & Busse PLLC; John P. Fonder

(57) ABSTRACT

A multi-level data center building, and a method of cooling servers in the building is disclosed. The building may have at least three data levels, each accommodating rack-storage areas for rows of server racks separating alternating hot and cold aisles, a plurality of air-handling units for supplying cooling air to the servers via the cold aisles, a cold-air supply corridor for transporting cold air from the air-handling units to the cold aisles and for providing access to the cold aisles, and a warm air return path for transporting warm air from the hot aisles to the air-handling units. Ends of cold aisles may be along a first side of the corridor, and the air-handing units along a second side opposite the first side. The rack storage areas, cold aisles, hot aisles, cold air supply corridor, warm air return path, and the air-handling units are within the building envelope.

20 Claims, 10 Drawing Sheets

(58) Field of Classification Search
CPC ........... H05K 7/20136; H05K 7/20345; H05K 7/20554; H05K 7/20754; H05K 7/20827; H05K 7/20836; E04H 2005/005; E04H 5/00; E04H 1/06; E04H 5/02; G06F 1/20; F24F 13/06; F24F 2011/0006; F24F 2221/40
See application file for complete search history.

(56) References Cited

U.S. PATENT DOCUMENTS

| | | | |
|---|---|---|---|
| 11,060,312 B1 | 7/2021 | Hill et al. | |
| 11,629,871 B1 * | 4/2023 | Meyers | F24F 7/06 454/186 |
| 2009/0241578 A1 | 10/2009 | Carlson et al. | |
| 2011/0083824 A1 * | 4/2011 | Rogers | H05K 7/20754 312/236 |
| 2011/0189936 A1 | 8/2011 | Haspers et al. | |
| 2014/0157692 A1 | 6/2014 | Parizeau et al. | |
| 2015/0159389 A1 | 6/2015 | Parizeau et al. | |
| 2016/0057894 A1 * | 2/2016 | Chen | H05K 7/20745 361/679.46 |
| 2016/0249484 A1 | 8/2016 | Parizeau et al. | |
| 2017/0196126 A1 | 7/2017 | Mao et al. | |
| 2019/0159365 A1 * | 5/2019 | Snip | E04B 5/48 |
| 2020/0056392 A1 * | 2/2020 | Harinck | A47B 96/1408 |
| 2021/0345526 A1 * | 11/2021 | Thornton | H05K 7/20145 |
| 2022/0022341 A1 | 1/2022 | Venugopal et al. | |

FOREIGN PATENT DOCUMENTS

| | | | |
|---|---|---|---|
| CN | 104238689 | A | 12/2014 |
| CN | 105066303 | A | 11/2015 |
| CN | 210840456 | U | 6/2020 |
| CN | 212138198 | U | 12/2020 |
| CN | 112930073 | A | 6/2021 |
| CN | 219395404 | U | 7/2023 |
| CN | 221178297 | U | 6/2024 |
| WO | WO 2010/139921 | A1 | 12/2010 |
| WO | WO 2011/148175 | A2 | 12/2011 |
| WO | WO 2016/131138 | A1 | 8/2016 |
| WO | WO 2016/207323 | A1 | 12/2016 |
| WO | WO 2017/129448 | A1 | 8/2017 |
| WO | WO 2020/053569 | A1 | 3/2020 |

* cited by examiner

DATA CENTER

PRIORITY CLAIM

The present application is a National Phase entry of PCT Application No. PCT/GB2023/053070, filed Nov. 24, 2023, which claims priority from Great Britain Patent Application Number 2217691.1, filed Nov. 25, 2022, the disclosures of which are hereby incorporated by reference herein in their entirety.

FIELD OF THE INVENTION

The present invention concerns data centers and a method of cooling servers in a data center. More particularly, but not exclusively, this invention concerns data center buildings and methods of constructing data center buildings.

BACKGROUND OF THE INVENTION

A data center is understood to be a large group of networked computer servers, typically provided in a dedicated space within a building. For example, a modern data center may include high density, high capacity IT systems in a specialist, dedicated space having a carefully controlled environment. A state of the art data center may include multiple data halls each containing hundreds or even thousands of computer servers, typically contained in racks arranged in rows. In general, each server is provided with electrical power and a network connection. During operation, components of servers typically generate heat, which should be dissipated to avoid overheating and damage to equipment. Organizations, and also individuals, treat data centers as mission-critical facilities, meaning that even short periods of down-time due to equipment malfunction is not tolerated. With the increase in demand for 'cloud' computing services, there is a need not only for additional data center facilities, but also higher capacity facilities. Alongside increases in computing power of individual servers, the number of servers in each rack, and the number of racks in each data hall increases with each new generation of data centers.

Various measures have been used to compare and contrast modern data centers, including the number of servers, building area, and power consumption. According to Data Centre Magazine, a hyperscale data center should exceed 5,000 servers and 10,000 square feet, and the three largest data center facilities in the world have total areas exceeding 7 million square feet. Hyperscale data centers often include multiple data halls, each being a single continuous space for accommodating servers. An individual data hall may include IT servers having a total power consumption of 3 MW or more. Racks, or cabinets, housing servers are typically arranged in rows separated by personnel aisles. In order to make efficient use of space, racks have become larger, and aisles longer. For example, a common modern rack design is capable of holding 42 servers stacked one on top the other (a '42 U' rack). The dimensions of server racks have become highly standardized, particularly in terms of width. Racks are typically 600 mm wide, and a 42 U rack may have a height of about 2300 mm, a depth of 1050 mm, and once fully loaded with servers may weigh as much as 2.4 tonnes. A single row of racks in the data hall of a Hyperscale data center may be made up of 22 or more racks, with the data hall accommodating 14 or more rows. Such a high dead load weight concentrated in a relatively small area can present challenges in building design. For example, a single row of racks occupying a floor space of under 16 $m^2$ (i.e. a row of racks taking up 15 m by 1.05 m) may weigh as much as 62.5 tonnes.

Data centers are sophisticated installations usually requiring high levels of accuracy in construction. Such requirements can make deployment of new facilities costly and time consuming. Traditionally, data center facilities have been built using conventional construction methods, where a bespoke building shell is constructed first, and then fitted out with the necessary services and equipment on-site. Typically, cooling equipment is treated in a similar manner to HVAC (heating, ventilation and air conditioning) equipment of other buildings, which is often located outside the fabric of the building (also known as a building envelope). Such positioning can provide various advantages, for example allowing equipment to be craned into place at a late stage of construction and/or when replacement equipment is provided. Furthermore, during the planning and approval process when consent is sought for a new building, an important measure considered by authorities is the floorspace or volume of a building, which is taken to be the space within the fabric, or envelope. Accordingly, locating HVAC equipment outside the envelope, on roof-top or side gantries or platforms can help to maximize the usable area within the building envelope.

Air flow management is considered especially important in modern data centers, where there is a continuing drive for lower PUE (power usage effectiveness) values. PUE is the ratio of total data center power consumption to server power consumption, and so minimising energy use for equipment cooling is often a high priority. WO2010139921 (Bripco BVBA) describes an especially energy efficient data center layout, in which the data center is subdivided into segregated hot and cold zones, including alternating hot and cold aisles separated by rows of server cabinets. Each cold aisle is supplied with cooling air from a cold air corridor, that also functions as a personnel access corridor, that leads from an air handling unit.

There remains a need for a data center design that combines efficient use of space with cost-effective operational costs and convenient commissioning and maintenance. The present invention seeks to mitigate various problems of the prior art. Alternatively or additionally, the present invention seeks to provide an improved data center building, and method of cooling IT equipment in a data center building.

SUMMARY OF THE INVENTION

The present invention provides, according to a first aspect, a multi-level data center building comprising a plurality of data levels, for example at least three data levels. Optionally, each data level accommodates at least fifteen, optionally at least twenty, rack storage areas positioned on a floor. Each rack storage area has a width and a length and is arranged to accommodate a row of at least ten, such as at least twenty, server racks. Each server rack is capable of accommodating at least 20 servers, such as at least 30 servers. Preferably, the rack storage areas separate alternating hot aisles and cold aisles. Each cold aisle and each hot aisle may have a width and a length. Optionally, each level comprises a plurality of air handling units for supplying cooling air to the servers via the cold aisles. Preferably, each air handling unit comprises an adiabatic cooling unit. Optionally, each level comprises a cold air supply corridor for transporting cold air from the air handling units to the cold aisles, and preferably being suitable for providing personnel access to the cold aisles.

The cold air supply corridor is in fluid communication with the cold aisles, for example through opening arranged along a first side of the corridor. Optionally, the cold air supply corridor may be positioned between, such as sandwiched between the air handling units and the cold aisles. Optionally, the air handling units may supply cooling air into a first side of the corridor, and the cold aisles may receive cooling air from a second opposed side of the corridor. Additionally or alternatively, the air handling units and cold aisles may be distributed along the length of the cold corridor on opposed sides, for example wherein an end of each cold aisle communicates with the cold corridor. Optionally, the cold air supply corridor extends perpendicular to the cold aisles. For example, the cold air supply corridor has a width and a length, the length extending perpendicular to the cold aisles. Optionally, each level comprises a warm air return path for transporting warm air from the hot aisles to the air handling units. Optionally, the plurality of air handing units are positioned along a second side of the cold air supply corridor opposite the first side (and thus opposite the cold aisles). Optionally, the rack storage areas, cold aisles, hot aisles, cold air supply corridor, warm air return path, and the air handling units are positioned within the building envelope. It has been found that such an arrangement confers a number of advantages. For example, a cold air supply corridor allows for high volumes of cooling air to be distributed to cold aisles at low velocity, the corridor allowing air from the air handling units to mingle and provide all cold aisles with cooling air even in the event of limited performance or failure of one or more air handling units. Furthermore, positioning multiple air handling units along the cold air supply corridor (e.g. along a side of the corridor) has been found to allow an especially high density of racks on each level, for example by allowing longer aisles with larger server racks without compromising availability of cooling air. The present inventors have recognized that externally located air handling equipment can be challenging to commission and maintain, for example because personnel are required to work outside at height and exposed to weather conditions. The present inventors have found that bringing air handling units inside the building envelope allows personnel to access equipment without having to leave the building envelope and without the sensation of working at height. The present inventors have further recognized that positioning air handling units along a common air supply corridor helps to make efficient use of space inside the building, for example because equipment redundancy can be provided across the level, rather than for each cold aisle, while also keeping air handling equipment in close proximity to the cold aisles. Yet further, the arrangement of the present invention allows each data level to be self-contained, allowing for a staged commissioning of the building. Optionally, the cold corridor transports cooling air to at least five cold aisles, such as at least seven cold aisles, and receives cooling air from at least three air handling units.

As used here, the 'building envelope' is the physical separator between the conditioned and unconditioned environment of a building, including for example the resistance to air, water, heat, light, and/or noise transfer between the interior and exterior of the building. Also known as the 'building enclosure', the building envelope may comprise the elements of the outer shell that maintain a dry, heated, or cooled indoor environment and facilitate its climate control. It will be understood that equipment mounted on gantry structures on the sides and/or top of a building are not located within a building envelope. For example, air handling equipment located on such gantry structures and fluidly connected to the internal space of the building via duct-work and/or piping would not be considered as being located within the building envelope. Additionally or alternatively, the building envelope may be referred to as the 'interior' of the building, while areas outside the building envelope may be referred to as the 'exterior', for example wherein personnel are able to move between all personnel areas located in the interior without having to exit the building envelope (i.e., without having to pass to the exterior and back into the interior again).

It will be understood that a rack storage area is a space sized and configured to accommodate the row of server racks, for example a row of at least 20 server racks. Optionally, the server racks that may be accommodated are 42 U or larger server racks, meaning racking capable of holding 42 or more servers. In an air-cooled data center, IT equipment (which becomes hot during use) is cooled by contact with cooling air. Such cooling air may be supplied by one or more air handling units. As used herein: a 'cold aisle' of an operational data center is a space adjacent a row of racks (for example between opposed rows of racks) from which rack-mounted IT equipment is able to draw cooling air; a 'hot aisle' is a space adjacent a row of racks (for example between opposed rows of racks) into which rack-mounted IT equipment is able to expel warm air. Typically, operational efficiency is improved by segregating hot aisles and cold aisles, thereby avoiding cooling air in a cold aisle mixing with warm air from a hot aisle before being used to cool IT equipment. Optionally, each cold aisle has a width of from 1 m to 2 m, such as 1.4 m to 1.6 m. Optionally, each hot aisle has a width of from 1 m to 2 m, such as 1 m to 1.4 m. Optionally, each rack storage area has a width of from 1 m to 1.5 m, such as about 1.2 m.

Optionally, each data level comprises at least three, such as at least four air handing units in fluid communication with the, or each, cold air supply corridor. Optionally, each data level comprises no more than eight, such as no more than six, air handling units in fluid communication with the, or each, cold air supply corridor. It will be understood that each data level may, for example, comprise one or more additional cold air supply corridors and associated cold and hot aisles, air handling units and warm return space. Optionally, each such cold air supply corridor, associated cold and hot aisles, air handling units and warm return space forms a data hall. Optionally, each data level comprises a plurality of data halls, such as at least three data halls, for example at least four data halls. Optionally, there are at least four, optionally at least five, data levels.

Optionally, the data center comprises a plurality of server racks located in the rack storage areas. Optionally, each server rack accommodates at least 20, such as at least 30, for example at least 40, servers. Optionally, the racks together with air entrainment panels segregate the hot and cold aisles. Optionally, the data center building is a hyperscale data center building, for example accommodating at least 5,000 servers (rack-mountable items of IT equipment), and/or having an IT floor-space of at least 10,000 square feet. It will be understood that IT floor-space is the sum total of space occupied by rack storage areas, cold aisles and hot aisles, in the data center building. Optionally, each data level comprises at least 15 rack storage areas each able to accommodate at least 20 racks, for example wherein each data level is configured to accommodate at least 300 racks, for example 300 racks capable of housing at least 40 severs. In such an arrangement, each data level is optionally capable of accommodating at least 12,000 servers. Optionally, each data level has a single IT area comprising rack storage areas, cold aisles and hot aisles. It will be appreciated that each data level may for example accommodate two or more separate IT areas. Optionally, each IT area is configured to accommodate at least 12,000 servers. Optionally, each IT area occupies a floor space of at least 1,000 square metres. A hyperscale data center building may be one that is configured, when fully operational, to be capable of operating at total power levels of at least 40 MW.

Optionally, the cold air supply corridor has a length extending perpendicular to and being in fluid communication with the cold aisles of the data level to receive from the cold air supply corridor cooling air supplied to the cold air supply corridor by a plurality of air handling units. A suitable cold corridor/cold aisle arrangement is described in WO2010139921 (Bripco BVBA), the contents of which are incorporated by reference. Specifically, that document describes a data center layout which utilizes personnel space for transport of large volumes of cooling air at low velocity, improving operating efficiency and making better use of space. Preferably, the air supply corridor is a personnel corridor, for example having a height of at least 3 m, such as at least 3.5 m, and a width of at least 2 m, such as at least 2.5 m, and optionally a length of at least 30 m, such as at least 40 m. Optionally, the air handling units are positioned alongside and distributed along the length of the cold air supply corridor. Optionally, during operation of the data center, cooling air from the air handing units enters the corridor through openings in the side of the corridor along its length.

Optionally, the warm air return space is a warm air plenum. Optionally, the warm air plenum extends above the cold aisles, the cold air supply corridor, and/or and the air handling units. It has been found that such an arrangement provides a particularly space efficient layout, for example by avoiding the need for extra floor space in to accommodate the warm air return space. Optionally, the warm air plenum is segregated from the cold aisles and the cold air supply corridor by a plurality of air entrainment panels suspended from a data level ceiling structure. It will be understood that the ceiling structure may be part of the load-bearing structure of the building, for example forming the floor of a level above. Optionally, the plurality of data levels comprises an uppermost data level, the ceiling structure of the uppermost data level forming at least a portion of a roof of the multi-level data center. Additionally or alternatively the plurality of data levels comprises a lowermost data level, the floor of the lowermost data level being the ground floor of the multi-level data center. Optionally, each data level includes one or more cold aisle service cassettes suspended from the ceiling structure. Service cassette systems are also disclosed in WO2017129448 (Bripco BVBA), the contents of which are incorporated by reference. Specifically, that document discloses cassettes suspendable from a building structure and equipped with air entrainment panels and data center services. Preferably, each cold aisle service cassette comprises components of a plurality of data center services, such as at least three services. For example, components may include a conduit for fire suppressant fluid, a cable tray, electrical power components (such as cabling and/or a bus-bar), networking cabling, lighting equipment and/or sensor equipment (such as motion, temperature and/or humidity sensor equipment). Optionally, each cold aisle service cassette comprises aisle air entrainment panels configured to cooperate with racks of IT equipment to segregate the hot and cold aisles. Optionally, each cold aisle service cassette comprises ceiling air entrainment panels configured to segregate cold aisles from a warm air plenum disposed between the ceiling air entrainment panels and said ceiling structure, said warm air plenum being in fluid communication with one or more hot aisles adjacent said cold aisle. For example, each data center level may comprise a warm air plenum for receiving hot air from hot aisles and transporting hot air to air handling units and/or exhaust vents on the building envelope. Optionally, said warm air plenum is positioned above the cold aisles, for example being segregated from said cold aisles by ceiling air entrainment panels.

Optionally, each air handling unit has a first end for receiving air to be treated and a second end for discharging treated air. Preferably, the first end is opposed to the second end and the adiabatic cooling unit is positioned between the first end and the second end. Optionally, the second end is positioned at the second side of the cold air supply corridor. Optionally, the first end is positioned at or adjacent the building envelope. Optionally, the air handling unit has an airflow path that extends in a straight line from the first end to the second end, for example wherein the airflow path extends in a direction parallel to the length of the cold aisles and perpendicular to the length of the cold air supply corridor. It has been found that with such an arrangement, cooling air provided by the air handling units tends to efficiently flow across the cooling air supply corridor into ends of the cold aisles.

Optionally, the building envelope comprises on each data level a plurality of controllable intake vents for admitting ambient air into the data center building, optionally wherein each intake vent is in fluid communication with an air handling unit. Optionally, each air handling unit is in fluid communication with at least one intake vent. Optionally, the building envelope comprises on each data level a plurality of controllable outlet vents for exhausting air out of the data center building, optionally wherein each outlet vent is in fluid communication with the warm air return path. Optionally, each data level comprises a plurality of controllable recirculation vents for controlling admission of warm air from the warm air return path to the air handling units. Optionally, each controllable inlet vent is positioned at or adjacent the second end of an air handling unit. In such an arrangement, ambient air may for example directly enter the air handing unit. Optionally, each controllable outlet vent is positioned above an air handling unit. For example, it may be that each controllable outlet vent is positioned on a portion of the building envelope defining a side of the warm air plenum immediately above an air handling unit.

Optionally, each data level comprises at least three air handling units for providing cooling air to cold aisles. Optionally, the air handling units are direct air handling units. It will be understood that a direct air handling unit provides cooling air that comprises or consists of a portion of ambient air from outside the data center building, optionally where said ambient air is treated to adjust its temperature and/or humidity. Direct air handling units, and suitable control methodologies are disclosed in WO2011/148175A1 (Bripco BVBA), the contents of which are incorporated herein by reference. Alternatively, the air handling units are indirect air handling units. Suitable indirect air handling units are disclosed in WO2016/207323A1 (Bripco BVBA), the contents of which are incorporated herein by reference. It will be understood that an indirect air handling unit provides air that consists substantially of (for example consists entirely of) air from inside the data center building, optionally having been treated to adjust its temperature and/or humidity. Optionally, an indirect air handling unit comprises a heat exchanger for transferring heat from air inside the building to air from outside the building, for example wherein internal air travels through the air handling unit along an internal airflow path segregated from an external airflow path along which air from outside the building travels. Preferably, the air handling units comprise adiabatic cooling units, and optionally are free from mechanical cooling units (such as direct expansion cooling units). It will be understood that a direct expansion mechanical cooling unit provides cooling by contacting air with coils containing a refrigerant that had been compressed then allowed to expand. Suitable adiabatic cooling units include so-called wetted matrix coolers (in which air to be cooled is passed through an array of a wetted material) and spray coolers.

Optionally, the building envelope has a plurality of sides, wherein each controllable inlet vent is located on a side that is free from controllable outlet vents. The present inventors have found that such an arrangement can help to avoid unwanted re-entry of warm air into the building, which may for example occur when inlet and outlet vents are placed on the same side of a building and/or in close proximity. Optionally wherein adjacent sides comprising controllable inlet and outlet vents meet at a corner. Optionally, such sides are planar, the planes being at an angle of at least 30 degrees to each other, such as an angle of from 30-60 degrees to each other, for example perpendicular to each other. It has been found that such an arrangement helps to maintain separation between exhaust and intake air.

Optionally, the data center building comprises an exhaust conduit for directing exhaust air, such as directing exhaust air away from the controllable air intakes. Optionally, the exhaust conduit is outside the building envelope. Optionally, the exhaust conduit comprises a plurality of sides extending from a closed lower end to an open upper end, wherein at least one side comprises one or more openings for receiving warm air exhausted by controllable exhaust vents of the building. Optionally, one or more sides of the exhaust conduit is formed by a portion of the building envelope, such as by an exterior wall of the building. Preferably, the exhaust conduit extends upwards from the lowermost data level, for example to the uppermost data level and/or to the roof of the building, for example wherein the open upper end of the conduit is positioned at or close to the roof. Optionally, each exhaust conduit is configured to receive exhaust air from controllable exhaust vents of a plurality of data levels, such as all data levels. It has been found that such an exhaust conduit can function as a chimney, allowing warm exhaust air to rise naturally to the top of the building away from air intakes. Optionally, the multi-level data center building comprises an exhaust conduit for receiving warm air from at least one controllable outlet vent of each of at least two data levels. Optionally, the exhaust conduit has at least two sides comprising a first side formed by the building envelope and a second side formed by a cowling. It has been found that forming at least one side of the exhaust conduit from the building envelope provides a particularly efficient structure. Optionally, the exhaust conduit comprises a third side formed by the building envelope. Optionally, the first and third sides each comprise a controllable outlet vent at each level. Optionally, the exhaust conduit comprises a fourth side formed by the building envelope, the fourth side being opposed to the second side, and the first side being opposed to the third side. For example, each data level may comprise an air handling unit positioned adjacent each of the opposed first and third sides of the exhaust conduit. It has been found that such an arrangement can be especially effective at helping to maintain exhaust and intake air separation when a data level comprises numerous air handling units positioned along the length of a cold air supply corridor. It will be appreciated that the building may additionally comprise controllable exhaust vents not associated with such an exhaust conduit.

Optionally, the data center building comprises a plurality of enclosed air handler servicing passageways. Optionally, each enclosed air handler service passageway is in fluid communication with the cold air supply corridor. Additionally or alternatively, each enclosed air handler servicing passageway optionally connects to the cold air supply corridor by an access door. Optionally, each passageway provides personnel access to a side of an air handling unit. For example, it may be that each passageway extends outwards from the air supply corridor alongside one or more air handling units. Optionally, serviceable components of each air handling unit are accessible via one or more of the air handler service passageways. For example, each component may be accessible from the cold air supply corridor via a service passageway. Optionally, the adiabatic cooler of each air handling unit (and other components if present, such as filter banks and/or fan banks) are accessible for servicing from a personnel area located within the building envelope, e.g. so that service personnel can access equipment from the cold air supply corridor without having to exit the building envelope. It has been found that such an arrangement provides an especially convenient and pleasant access route for personnel. It will be understood that such enclosed air handler servicing passageways are located within the building envelope, for example each enclosed service passageway is accessible by personnel from within the building without requiring personnel to exit the building. An enclosed passageway will be understood as being located within a weather-tight structure. It will be understood that a serviceable component is a component to which access is expected to be required during the planned working life of the air handling unit, for example to repair, clean and/or replace a component expected to deteriorate during normal use. Optionally, each air handling unit comprises a plurality of sections. For example, a direct air handing unit may comprise a filter bank at the first end, or between the first end and the adiabatic cooling unit. From time to time, filters in the filter bank may require repair, cleaning or replacement. Additionally or alternatively, each air handling unit optionally comprises a plurality of fans for controlling transport of cooling air from the air handling unit to the servers via the cold air supply corridor and the cold aisles. For example, each air handling unit may comprise a fan bank for air circulation. It will be appreciated that such fans may require periodic inspection, repair and/or replacement. Optionally, each air handling unit is subdivided into a plurality of sections, for example where each section is accessible through a side-door that provides access from the service passageway.

Optionally, each air handling unit is located on a data level between the floor structure and the ceiling structure of the data level, for example inside of an exterior wall of the data level. It will be understood that an exterior wall forms part of the weather-tight shell of a building. Optionally, said floor structure of a data level is a substantially continuous structure (e.g., formed from a plurality of structural units) that defines the floor of the data level on which components of the data level are supported (including IT racks and air handling units). Similarly, said ceiling structure is optionally a substantially continuous structure (e.g., formed from a plurality of structural units) that defines the ceiling of the data level from which overhead services are suspended.

Optionally, the multi-level data center building comprises a service riser area, for example accommodating data center services extending between data levels. Optionally, the service riser area extends across multiple, e.g., all, data levels, for example providing a services route from lower to higher levels. Preferably, such a riser area is contained within the building envelope.

Optionally, each air handling unit comprises one or more, optionally multiple, air blenders positioned between the adiabatic cooling unit and the cold air supply corridor. It will be understood that an air blender is a device that promotes air mixing. It has been found that such air mixing can help improve cooling air homogeneity. Optionally, each air blender comprises a plurality of fins oriented to disrupt air flow thereby mixing air flowing through the air handling unit. It has been found that mounting air blenders on the air handling units helps to maximize the free personnel space in the cold air supply corridor.

According to a second aspect, there is also provided a method of cooling servers in a multi-level data center building of the first or third aspect of the invention. Optionally, the method comprises operating the air handing unit to provide cooling air for cooling the servers. Optionally, the method comprises transporting cooling air from the air handling units to the servers via the cold air supply corridor and the cold aisles. Optionally, the method comprises transporting warm air from the servers to the air handling units via the warm area. Optionally, the method comprises transporting air along an airflow path leading from the air handling units to the servers via the cold air supply corridor and the cold aisles and from the servers to the air handling units via the warm area, wherein the airflow path is located within the building. Optionally, the method comprises expelling warm air into the exhaust conduit, wherein warm air from multiple levels of the data center building is expelled into at least one common exhaust conduit, optionally wherein the exhaust conduit conveys exhaust air away from air intakes on the building, for example towards and out of an open second end positioned at or near the roof of the building.

According to a third aspect, there is provided a multi-level data center building comprising a plurality of vertically separated levels. Preferably, each level is positioned between a floor and a ceiling, and is bounded by at least one exterior wall of the building. It will be understood that an exterior wall of a building is a part of the shell (or envelope) of a building that provides a physical separation between the interior of a building and the exterior, for example being a weather-tight barrier. Optionally, each data level comprises at least twenty rack storage areas positioned on the floor, each rack storage area being arranged to accommodate a row of at least ten server racks each capable of accommodating at least twenty servers, the rack storage areas separating interleaved hot aisles and cold aisles. Optionally, each level comprises at least three air handling units for supplying cooling air to the servers via the cold aisles, optionally wherein each air handling unit comprises an adiabatic cooling unit. Optionally, each level comprises a cold air supply corridor for transporting cold air from the air handling units to the cold aisles above the floor and for providing personnel access to the cold aisles. Optionally, each level comprises a warm air return path for transporting warm air from the hot aisles to the air handling units. Optionally, the plurality of air handing units are located between the cold air supply corridor and the at least one exterior wall of the building. Optionally, the cold air supply corridor is in fluid communication with the cold aisles through openings arranged along a first side of the cold air supply corridor. Optionally, the cold air supply corridor is in fluid communication with the air handling units through openings arranged along a second opposed side of the cold air supply corridor.

Optionally, each air handling unit has a first end for receiving air to be treated and a second end for discharging treated air, the first end being opposed to the second end and the adiabatic cooling unit being positioned between the first end and the second end. Preferably, the second end is positioned at the second side of the cold air supply corridor. Preferably, the first end is positioned at or adjacent said at least one exterior wall of the building. Optionally, the at least one exterior wall of each data level comprises one or more of: (1) a plurality of controllable intake vents for admitting ambient air into the data center building, optionally wherein each controllable intake vent is in fluid communication with an air handling unit, optionally wherein each air handling unit is in fluid communication with at least one intake vent; (2) a plurality of controllable outlet vents for exhausting air out of the data center building, optionally wherein each controllable outlet vent is in fluid communication with the warm air return path. Optionally, each data level comprises a plurality of controllable recirculation vents for controlling admission of warm air from the warm air return path to the air handling units. Optionally, each controllable inlet vent is located on an exterior wall that is free from controllable outlet vents, optionally wherein adjacent exterior walls comprising controllable inlet and outlet vents meet at a corner. Optionally, the data center comprises an exhaust conduit for receiving warm air from at least one controllable outlet vent of each of the plurality of levels, wherein the exhaust conduit has at least two sides comprising a first side formed by one exterior wall of the building and a second side formed by a cowling. Optionally, the exhaust conduit comprises a third side formed by another exterior wall of the building, and wherein the first and third sides each comprise a controllable outlet vent at each level. Optionally, the exhaust conduit comprises a fourth side formed by a further exterior wall of the building, the fourth side being opposed to the second side and the first side being opposed to the third side. It will be appreciated that walls may be understood as those vertical parts of the building shell that meet at a corner. Optionally, each data level comprises a plurality of enclosed air handler servicing passageways, each enclosed air handler servicing passageway providing personnel access to a side of an air handling unit.

It will be appreciated that the data center of the third aspect of the invention may incorporate any feature described with referenced to the data center of the first aspect of the invention, and vice versa.

According to a fourth aspect of the invention, there is provided a method of making a multi-level data center building comprising a building envelope and a plurality of data levels. Optionally, the method comprises creating each data level by defining on a floor of the building (1) at least twenty rack storage areas, each rack storage area being arranged to accommodate a row of at least ten server racks each capable of accommodating at least twenty servers, the rack storage areas separating alternating hot aisles and cold aisles; and, (2) a cold air supply corridor for transporting cold air from air handling units to the cold aisles and for providing personnel access to the cold aisles, the cold air supply corridor being in fluid communication with the cold aisles through openings arranged along a first side of the cold air supply corridor. Optionally, the method further comprises installing on each floor a plurality of air handling units for supplying cooling air to the servers via the cold aisles, optionally wherein each air handling unit comprising an adiabatic cooling unit. Optionally, the method comprises forming within each data level a warm air return path for transporting warm air from the hot aisles to the air handling units. Optionally the rack storage areas, cold aisles, hot aisles, cold air supply corridor, warm air return path, and the air handling units are positioned within the building envelope.

Optionally, the method comprises forming in the building envelope at each data level at least one of: (1) a plurality of intake openings each comprising a controllable intake vent for admitting ambient air into the data center building, optionally wherein each controllable intake vent is in fluid communication with an air handling unit, optionally wherein each air handling unit is in fluid communication with at least one intake vent; (2) a plurality of outlet openings each comprising a controllable outlet vent for exhausting air out of the data center building, optionally wherein each controllable outlet vent is in fluid communication with the warm air return path. Optionally, the method comprises forming outside the building envelope an exhaust conduit for receiving warm air from at least one controllable outlet vent of each of the plurality of levels. Optionally the exhaust conduit has at least two sides comprising a first side formed by one exterior wall of the building and a second side formed by a cowling. Optionally, the exhaust conduit comprises a third side formed by another exterior wall of the building, and optionally the first and third sides each comprise a controllable outlet vent at each level. Optionally the exhaust conduit comprises a fourth side formed by a further exterior wall of the building, optionally wherein the fourth side is opposed to the second side and/or the first side is opposed to the third side.

Optionally, the data center formed according to the method of the fourth aspect of the invention is a data center according to the first aspect of the invention. It will be appreciated that the method of the fourth aspect of the invention may incorporate any feature described with reference to the data center of the first aspect of the invention, and vice versa.

According to a fifth aspect of the invention, there is provided a method of making a multi-level data center building comprising a plurality of vertically separated levels. Optionally, the method comprises forming each level between a floor and bounding each level by at least one exterior wall of the building. Optionally, the method comprises creating on each level: (1) at least twenty rack storage areas positioned on the floor, each rack storage area being arranged to accommodate a row of at least ten server racks each capable of accommodating at least twenty servers, the rack storage areas separating interleaved hot aisles and cold aisles; (2) a cold air supply corridor for transporting cold air from air handling units to the cold aisles above the floor and for providing personnel access to the cold aisles; (3) a warm air return path for transporting warm air from the hot aisles to the air handling units. Optionally, the method comprises installing on each level at least three air handling units for supplying cooling air to the servers via the cold aisles, optionally wherein each air handling unit comprises an adiabatic cooling unit. Optionally, the plurality of air handing units are located between the cold air supply corridor and the at least one exterior wall of the building. Optionally, the cold air supply corridor is in fluid communication with the cold aisles through openings arranged along a first side of the cold air supply corridor. Optionally, the cold air supply corridor is in fluid communication with the air handling units through openings arranged along a second opposed side of the cold air supply corridor. Optionally, the method comprises forming for each level in at least one exterior wall of the building at least one of (1) a plurality of intake openings each comprising a controllable intake vent for admitting ambient air into the data center building, optionally wherein each controllable intake vent is in fluid communication with an air handling unit, optionally wherein each air handling unit is in fluid communication with at least one intake vent; (2) a plurality of outlet openings each comprising a controllable outlet vent for exhausting air out of the data center building, optionally wherein each controllable outlet vent is in fluid communication with the warm air return path. Optionally, the method comprises forming outside the at least one exterior wall an exhaust conduit for receiving warm air from at least one controllable outlet vent of each of the plurality of levels. Optionally the exhaust conduit has at least two sides comprising a first side formed by the at least one exterior wall of the building and a second side formed by a cowling. Optionally the exhaust conduit comprises a third side formed by another exterior wall of the building. Optionally the first and third sides each comprise a controllable outlet vent at each level. Optionally the exhaust conduit comprises a fourth side formed by a further exterior wall of the building. Optionally the fourth side is opposed to the second side and/or the first side is opposed to the third side.

Optionally, the data center formed according to the method of the fifth aspect of the invention is a data center according to the third aspect of the invention. It will be appreciated that the method of the fifth aspect of the invention may incorporate any feature described with reference to the data center of the third aspect of the invention and vice versa.

It will of course be appreciated that features described in relation to one aspect of the present invention may be incorporated into other aspects of the present invention. For example, the method of the invention may incorporate any of the features described with reference to the apparatus of the invention and vice versa.

BRIEF DESCRIPTION OF THE DRAWINGS

Embodiments of the present invention will now be described by way of example only with reference to the accompanying schematic drawings of which.

Figure 1:
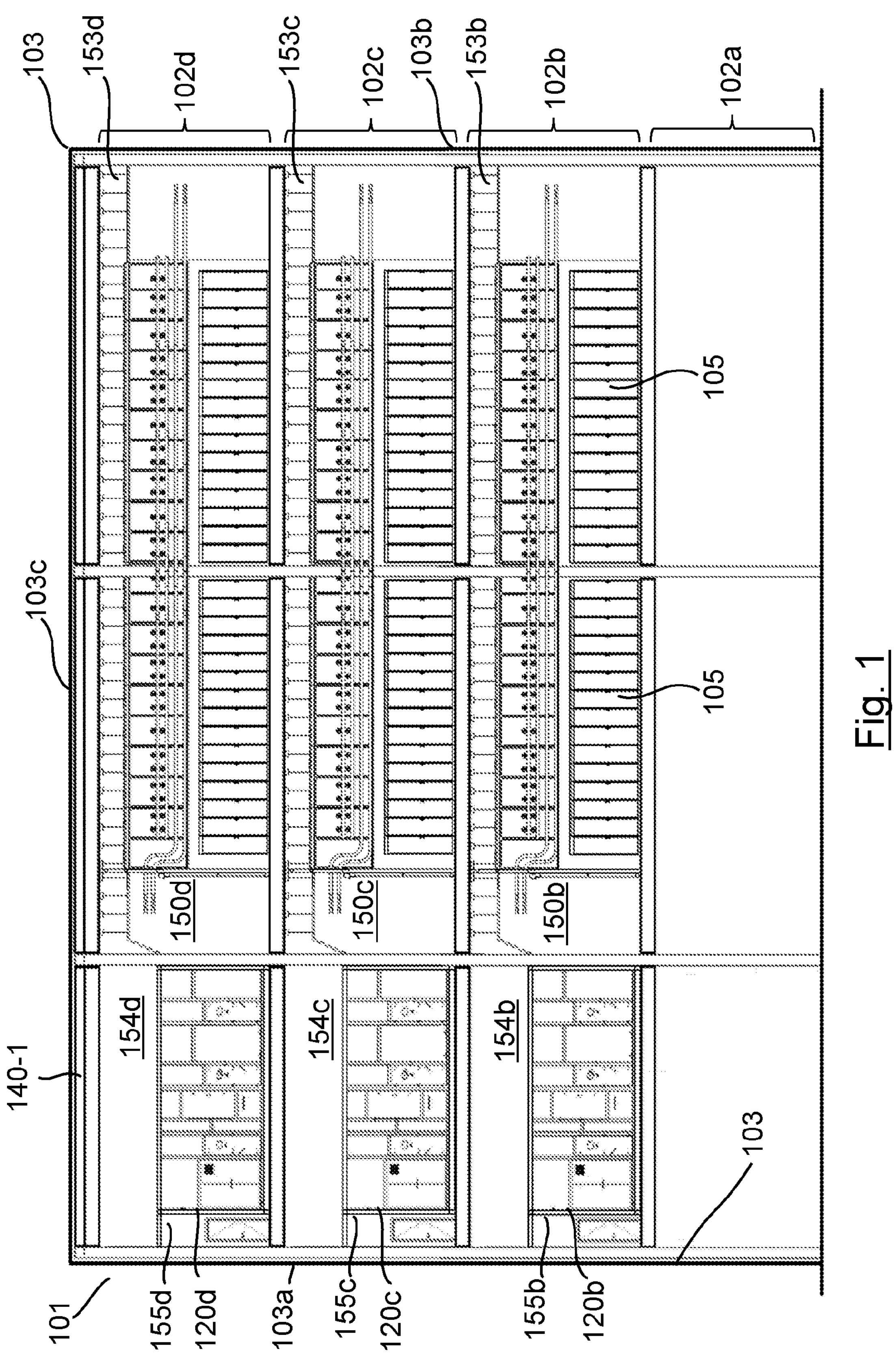
FIG. 1 shows a side cross-sectional view of a multi-level data center building according to an embodiment of the invention.
Figure 4:
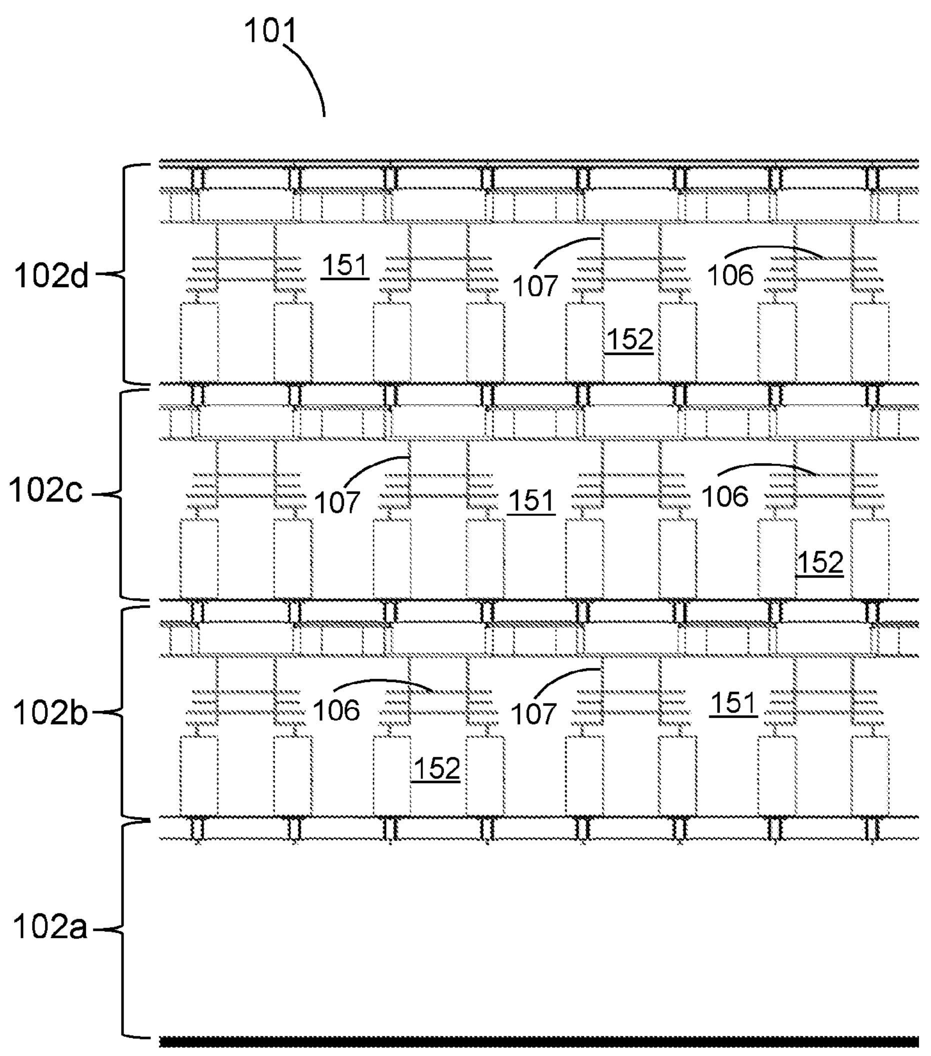
FIG. 4 shows an end cross-sectional view through a portion of the data center of FIG. 1.
Figure 6:
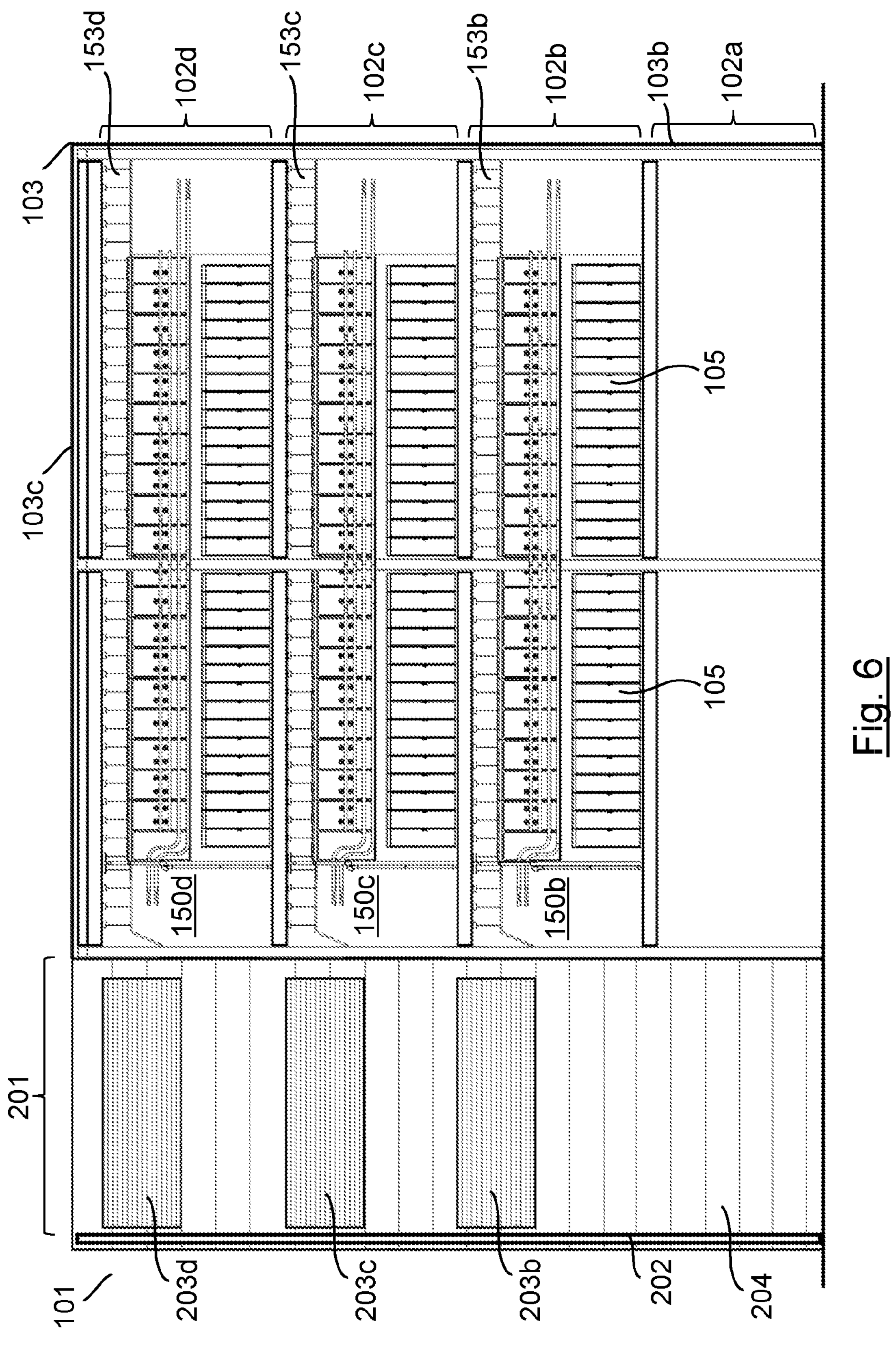
FIG. 6 shows a side cross-sectional view through a portion of the data center of FIG. 1.
Figure 8A:
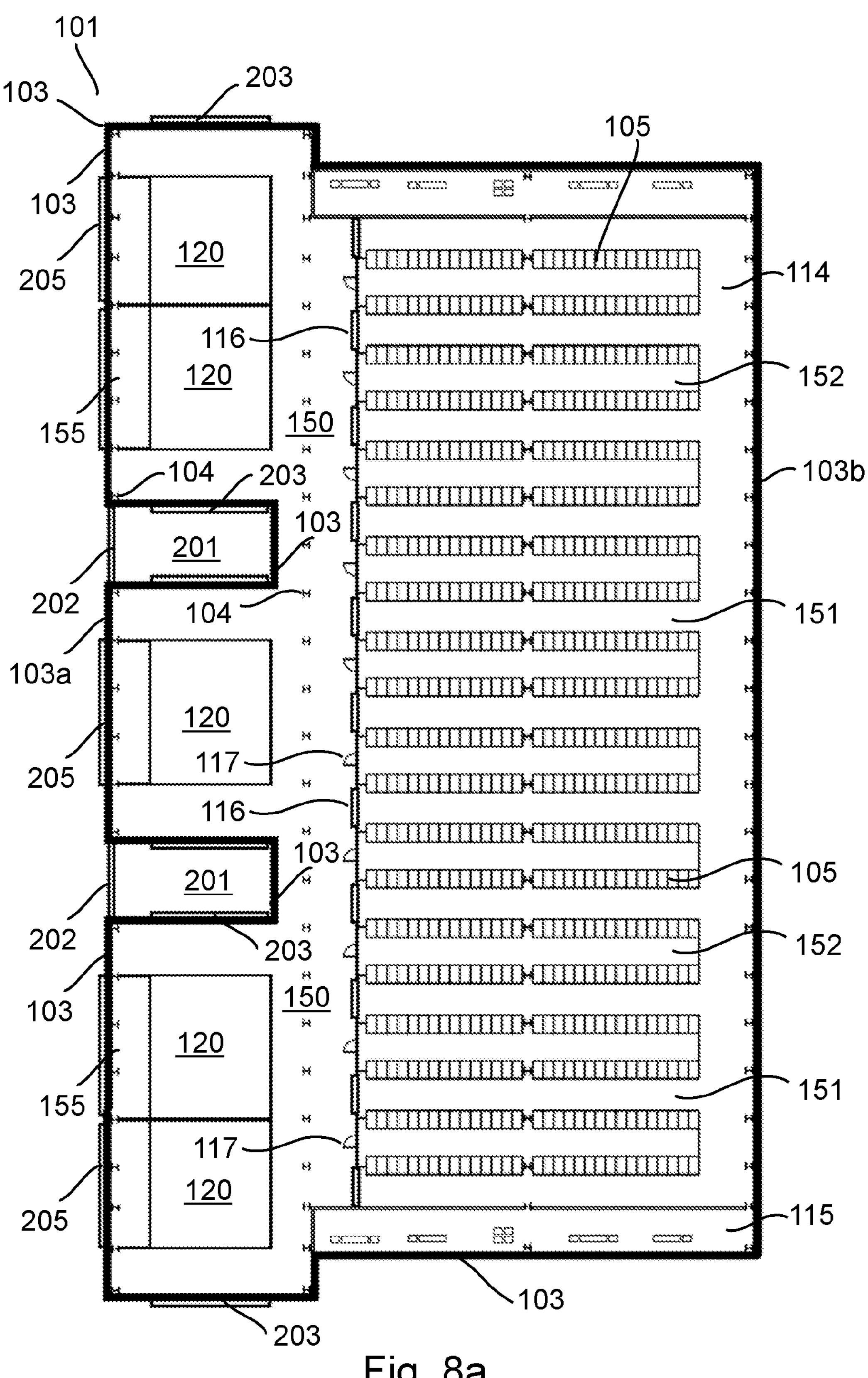
Figure 9:
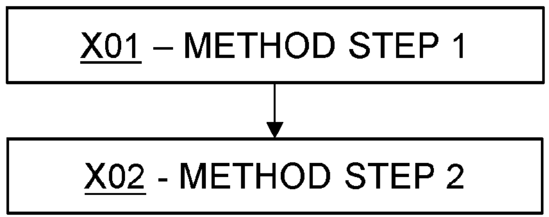

FIG. **8*a* shows a plan view of data level of the data center of FIG. 1**;

FIG. **8*b* shows the plan view of FIG. 8*a*, annotated to indicate the positions of the views of FIGS. 1, 4 and 6**;

FIG. 9 illustrates steps of a method of cooling servers in the multi-level data centre building of FIGS. **1-8*b*;**

Figure 10:
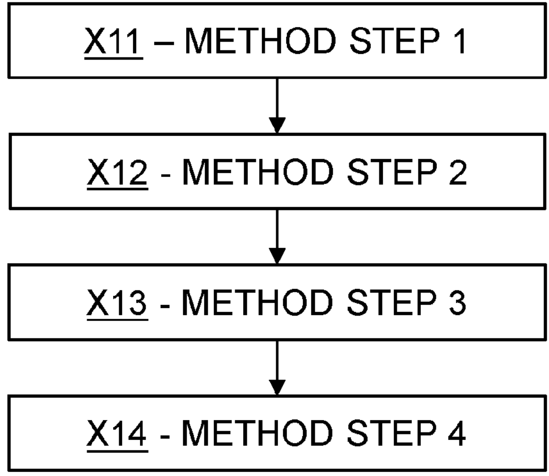

FIG. 10 illustrates steps of a method of constructing the multi-level data centre building of FIGS. 1-8*b*.

DETAILED DESCRIPTION

FIG. 1 shows a side cross-sectional view of a multi-level data centre building 101 according to the invention. The building 101 comprises a mechanical and electrical services level 102*a* on the ground floor, and three data levels 102*b*, 102*c*, 102*d* on the floors above. The mechanical and electrical services level 102*a* houses ancillary equipment, including 'uninterrupted power supply' (UPS) equipment, and power and data distribution equipment, not shown in FIG. 1. Each data level 102*b*-*d* comprises twenty rack storage areas arranged between alternating hot and cold aisles, with each rack storage area accommodating a row of 31 server racks 105. The server racks each hold up to 42 servers. The view shown in FIG. 1 cuts along a cold aisle, and thus illustrates the fronts of server racks 105.

Each data level 102*b*-*d* comprises a plurality of air handling units for providing cooling air to the cold aisles. FIG. 1 shows air handling units 120*b*-*d* of data levels 102*b*-*d*, respectively. Illustrated in FIG. 1 are the side covers and access doors of the air handler units 120*b*-*d*.

When the data center 101 is operational, cooling air is supplied by air handler units 120*b*/*c*/*d* into cold corridors 150*b*/*c*/*d*, respectively. The cold corridors 150*b*/*c*/*d* run perpendicular to cold aisles, receiving cooling air from the multiple air handlers on each data level and transporting said cooling air to the multiple cold aisles. From the cold aisles, cooling air passes into server racks 105, thereby cooling the servers and becoming warm air and exiting into the hot aisles. Warm air passes upwards from the hot aisles to overhead warm air return plenums 153*b*/*c*/*d* on each level, and then into a warm air return space 154*b*/*c*/*d* above the air handler units 120*b*/*c*/*d*. From that space, warm air may be ejected from the building through warm air exhaust vents (not shown in FIG. 1) and/or passed into mixing chambers 155*b*/*c*/*d* upstream of the air handler units 120*b*/*c*/*d* for mixing with ambient air from outside the building 101. Ambient air enters the mixing chambers 155*b*/*c*/*d* through air intake vents (not shown in FIG. 1).

Figure 2:
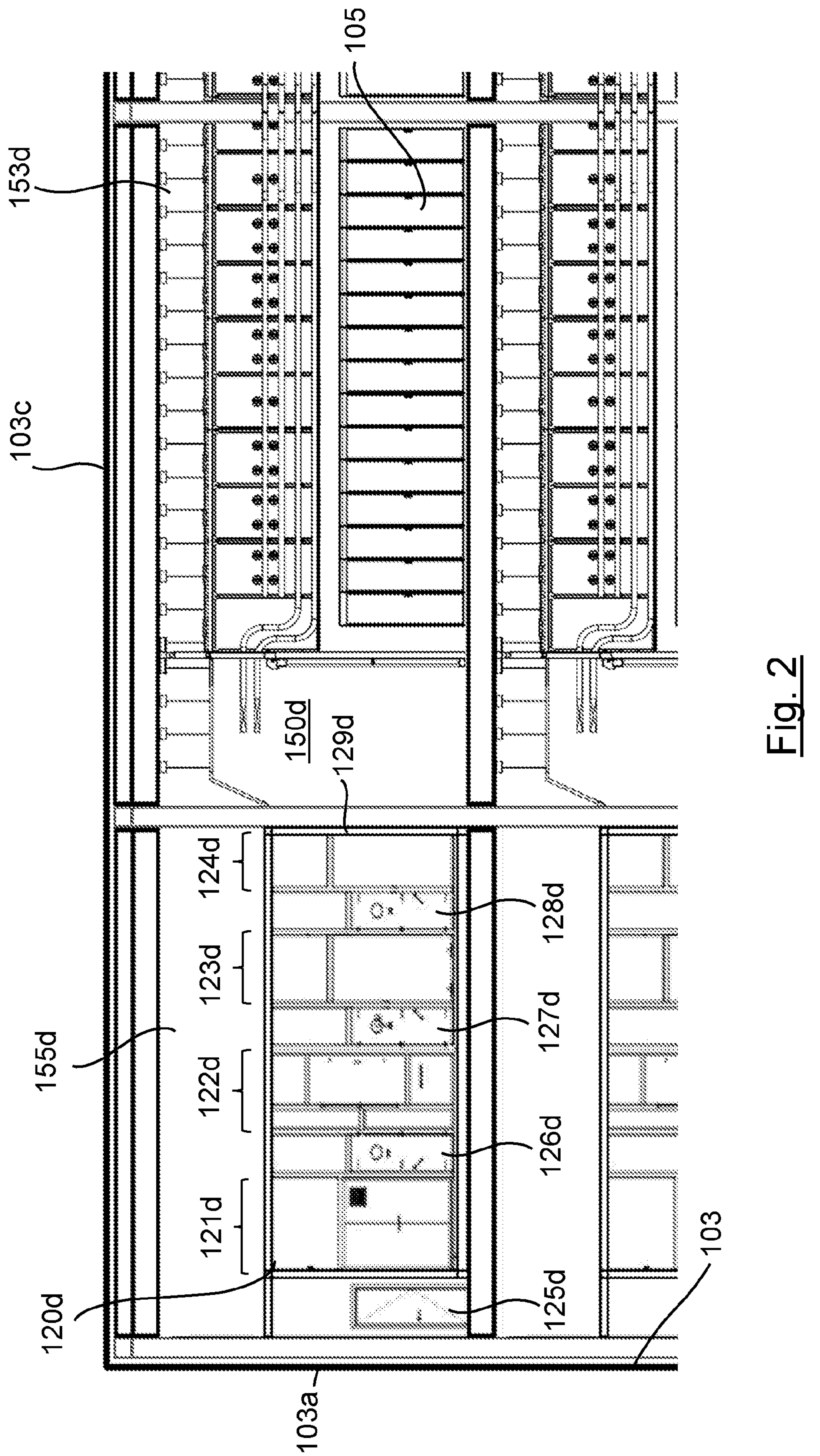
FIG. 2 shows an enlarged portion of the drawing of FIG. 1.

FIG. 2 shows an enlarged portion of the drawing of FIG. 1, annotated with the same reference numerals as used in FIG. 1. As shown in FIG. 2 with reference to air handler unit 120*d*, the air handler unit 120*d* is made up of multiple sections. The sections include a filter bank 121*d*, a fan bank 122*d*, an adiabatic cooler (such as a wetted matrix cooling system) 123*d*, and an air blender 124*d*. An access door 125*d* provides access to the mixing chamber 155*d*, and further access doors 126*d*, 127*d* and 128*d* provide access to the section of the air handler 120*d*. The air handler sections are mounted in a support frame 129*d*.

The data center building 101 comprises a weather-tight building envelope 103. The building envelope 103 comprises exterior walls 103*a*, 103*b*, and roof 103*c*. It will be appreciated that the building envelope may be of any suitable construction, such as sheet materials, e.g. cladding panels. As shown in FIGS. 1 and 2, the server racks 105, hot and cold aisles, cold air supply corridor 150*b*/*c*/*d* and air handling units 120*b*/*c*/*d* are all positioned within the building envelope 103. As will be appreciated from FIG. 2, personnel can move between areas within the building envelope 103, such as between the cold corridor 150*d*, hot and cold aisles and air handler 120*d* (e.g. via air access doors 125*d*/126*d*/127*d*/128*d*) without having to exit the building, and thus without having to travel or work outside.

Figure 3:
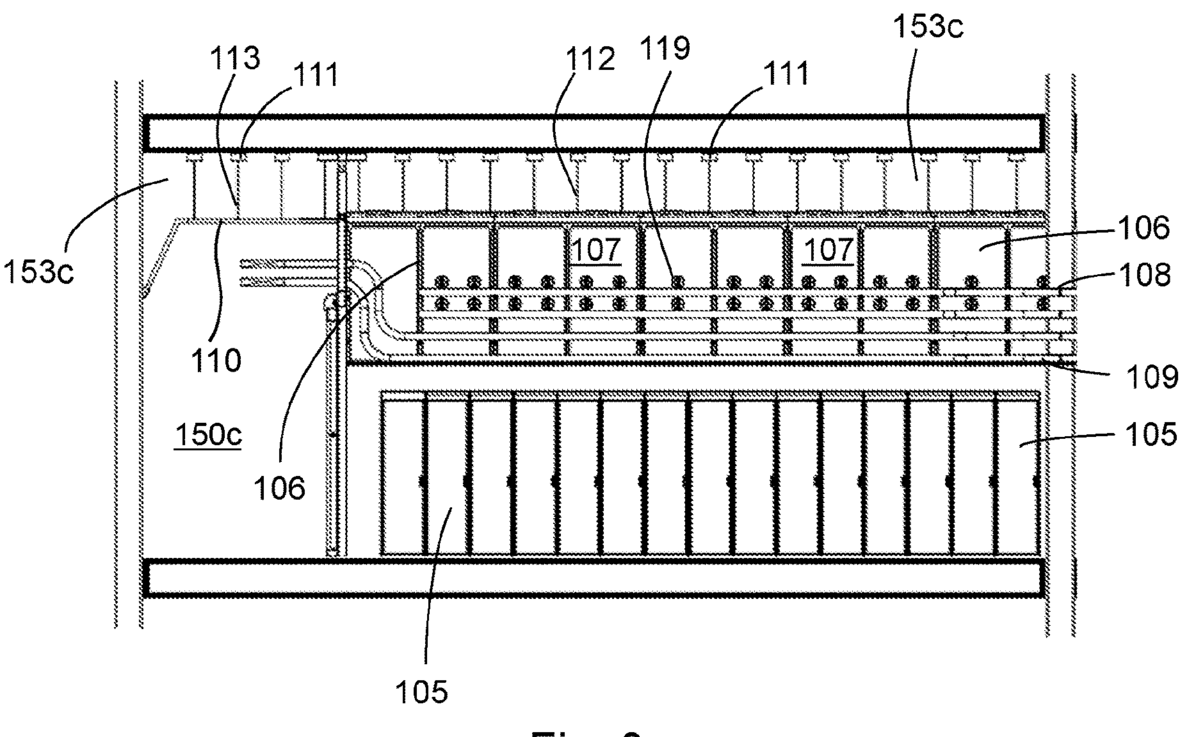
FIG. 3 shows a further enlarged portion of the drawing of FIG. 1.

FIG. 3 shows a further enlarged portion of the drawing of FIG. 1, annotated with the same reference numerals as used in FIG. 1. In FIG. 3, a portion of a row of IT racks 105 is shown with a corresponding row of service cassettes 106 suspended above them. The service cassettes 106 are shown comprising air entrainment panels 107, electrical cable trays 108 and network cable trays 109 above the IT racks 105. Further suspended air entrainment panels 110 form the ceiling separating the cold corridor 150*c* from the warm air plenum 153*c*. The air entrainment panels 107 of the service cassettes 106 segregate the hot and cold aisles. Openings 119 in panels 107 are provided to accommodate services passing between hot and cold aisles. The openings include adjustable covers to maintain air segregation between aisles. Drop-rods 112 fastened to brackets 111 support the service cassettes 106. Further drop-rods 113 secured to slot channel beams (not shown in FIG. 3) fastened to brackets 111 support the air entrainment panels 110.

FIG. 4 shows an end cross-sectional view through a portion of the data center 101 of FIG. 1, labelled with the same reference numerals as used in FIGS. 1-3. As in FIG. 1, FIG. 3 shows services level 102*a* and data levels 102*b*-*d*. The view of FIG. 3 cuts across cold aisles 151 and hot aisles 152.

Figure 5:
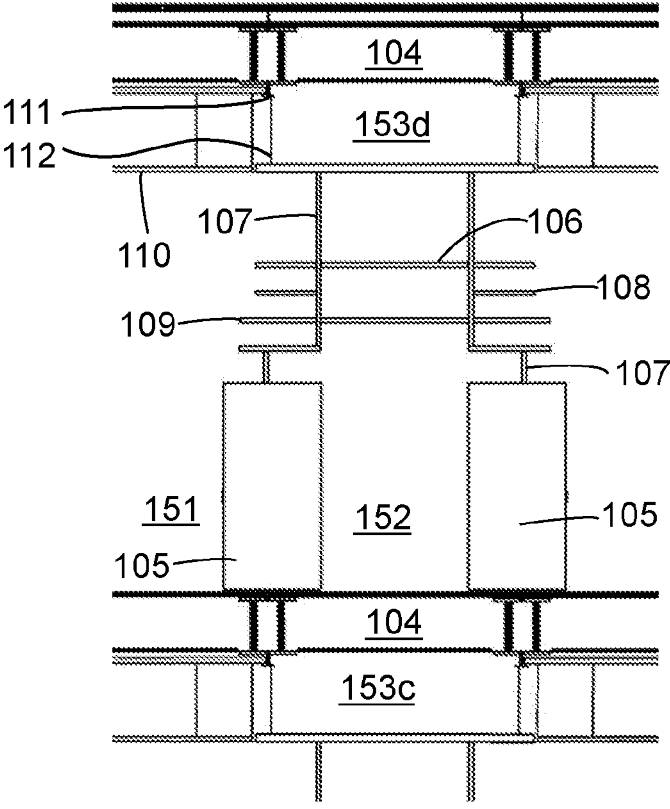
FIG. 5 shows an enlarged view of a portion of FIG. 4.

FIG. 5 shows an enlarged view of a portion of FIG. 4. As shown in FIG. 5, service cassettes 106 are suspended from brackets 111 mounted on the structure of the building 104.

FIG. 6 shows a side cross-sectional view through a portion of the data center 101 of FIG. 1. Features corresponding to those shown in FIG. 1 are labelled with the same reference numerals. The view of FIG. 6 cuts through the interior of the building 101 and also through an exhaust conduit 201 that extends across levels 120*a*-*d*. The exhaust conduit 201 is defined on three sides by exterior walls of the building envelope 103 (the exhaust conduit positioned outside the envelope 103), and on a fourth side by cowling 202. The exhaust conduit provides a space for receiving warm air ejected from the building envelope 103 through controllable exhaust vents 203*b*/*c*/*d*, which vents are positioned in the envelope 103 adjacent warm air return spaces 154*b*/*c*/*d*, respectively, above air handling units 120*b*/*c*/*d*, respectively (not shown in FIG. 6—see FIG. 1). During operation of the data center building 101, warm air from warm air return space 154*b*/*c*/*d* is ejected from the envelope 103 through controllable exhaust vents 203*b*/*c*/*d* into the exhaust conduit 201. As shown in FIG. 6, the building envelope 103 forming three sides of the exhaust structure 201 comprises weather-tight cladding panels 204. The exhaust conduit 201 directs warm air upwards towards the roof of the building 101, thereby avoiding inadvertent mixing between warm air exhausted from the building and fresh ambient air being drawn into the building for use as fresh cooling air.

Figure 7:
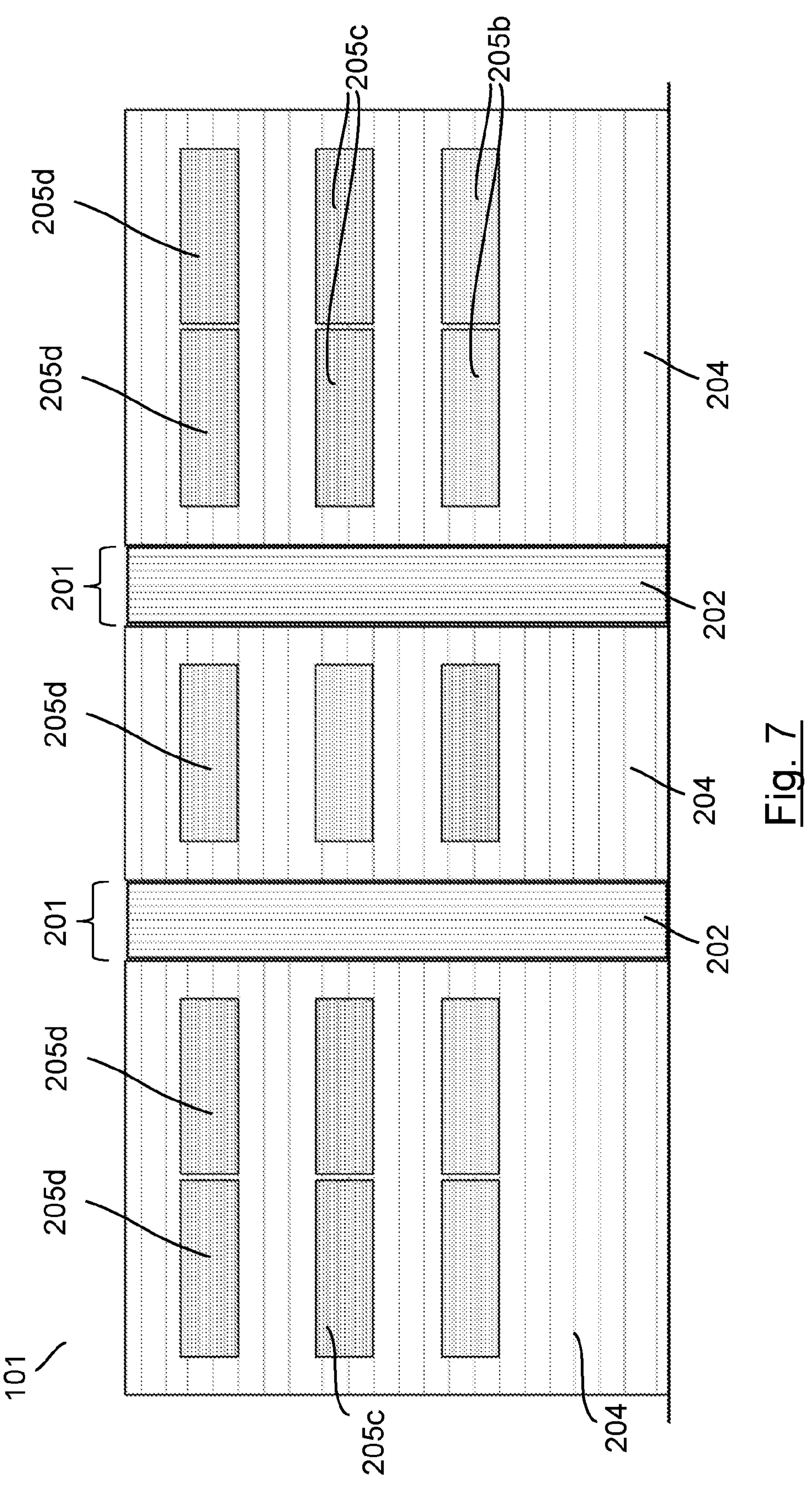
FIG. 7 shows an end elevation of the data center building of FIG. 1

FIG. 7 shows an end elevation of the data center building 101 of FIG. 1, showing controllable ambient air intakes 205*b*/*c*/*d* arranged on the external sides of the building envelope, and exhaust conduits 201 enclosed by cowling 202. During operation of the data center building 101, ambient air from outside the data center building 101 is drawn in through controllable air inlets 205*b*/*c*/*d* into mixing chambers 155*b*/*c*/*d*, and then into air handling units 120*b*/*c*/*d*, respectively (not shown in FIG. 7). As shown in FIG. 7, ambient air is thus drawn into the end of the data center building, while warm air ejected into exhaust conduits 201 is directed upwards and out of the top of the building.

FIG. 8*a* shows a plan view of data level 102*c* of the data center 101 of FIG. 1, labelled with the same reference numerals as used in FIGS. 1-7 (except that, for clarity, the 'c' suffix is omitted). In the floorplan shown in FIG. 8*a*, the IT area of the data level includes cold aisles 151, hot aisles 152, rack storage areas accommodating racks 105, and connecting corridor 114 (which links cold aisles 151 together). In use, cooling air is provided by air handler units 120, which deliver cooling air into one side cold corridor 150, which transports and distributes cold air to cold aisles 151 through vented access doors 116, which provide controlled fluid communication and personnel access between the cold corridor 150 and cold aisles 151. Examples of vented doors are disclosed in WO2010139921 (Bripco BVBA), the contents of which are incorporated herein by reference. Personnel doors 117 provide access to hot aisles 152 from the cold corridor 150, while also maintaining air segregation between the cold corridor 150 and the hot aisles 152. It will be appreciated that personnel doors could additionally or alternatively be provided at the other end of hot aisles 152. Warm air is ejected from the building through controllable exhaust vents 203, and fresh ambient air is drawn in through controllable intake vents 205.

Figure 8B:
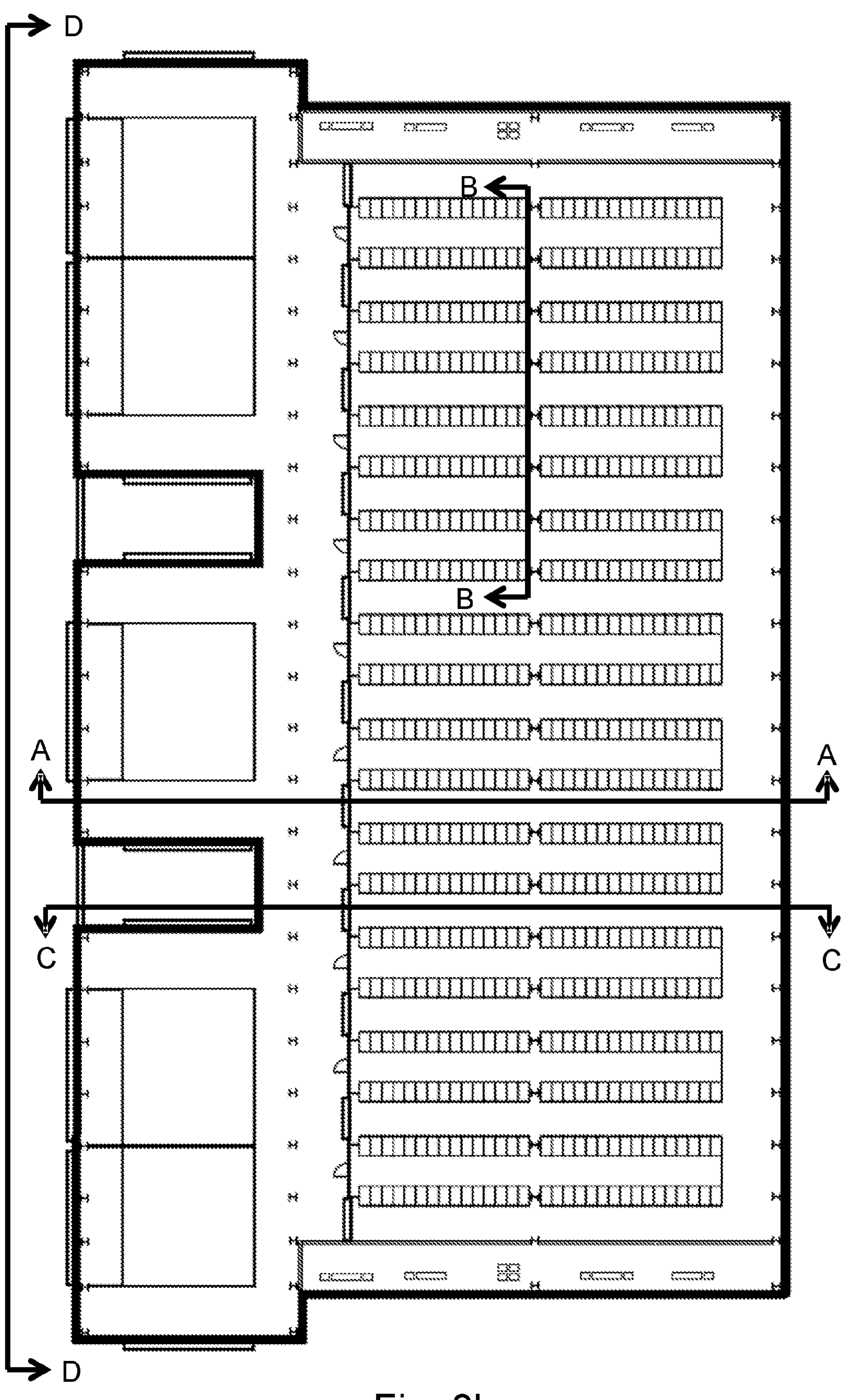

FIG. 8*b* shows the plan view of FIG. 8*a*, annotated to indicate the positions of the views of FIGS. 1, 4 and 6. Line A-A indicates the position of the view of FIG. 1. Line B-B indicates the position of the view of FIG. 4. Line C-C indicates the position of the view of FIG. 6. Line D-D indicates the position of the view of FIG. 7.

FIG. 9 illustrates steps of a method according to an embodiment of the invention, the method being a method of cooling servers in the multi-level data center building 101 of FIGS. 1-8*b*. In step X01, cooling air is transported along an airflow path leading from the air handling units 120 to servers in racks 105 via the cold air supply corridor 150 and the cold aisles 151, and from the servers to the air handling units 120 via the warm area comprising hot aisles 152 and warm air plenum 153. The airflow path is located within the building 101. In step X01, air is expelled from the interior of the building 101 into exhaust conduits 201 (via exhaust outlets 203), and conveyed upwards to the roof 103*c* of the building 101. Exhaust air from data levels 102*b*/*c*/*d* is combined in each exhaust conduit 201.

FIG. 10 illustrates steps of another method according to an embodiment of the invention, the method being for constructing the multi-level data center building 101 of FIGS. 1-8*b*. In step X11, each data level 102*b*/*c*/*d* is created by defining on respective floors of the building: (1) 20 rack storage areas, each arranged to accommodate a row of 31 server racks, and separating alternating hot aisles 152 and cold aisles 151; and (2) a cold air supply corridor 150 for transporting cold air from air handling units 120 to the cold aisles 151 and for providing personnel access to the cold aisles 151. The cold air supply corridor 150 is in fluid communication with the cold aisles 151 through vented doors 116 arranged along a first side of the cold air supply corridor 150. In step X12, the method comprises installing on each floor a plurality of air handling units 120 for supplying cooling air to the servers via the cold aisles 151. Each air handling unit comprises an adiabatic cooling unit. In step X13, the method comprises forming within each data level 102 a warm air return path for transporting warm air from the hot aisles 152 to the air handling units 120. The warm air return path comprises warm air plenum 153. In step X14, the method comprises forming in the building envelope 103 at each data level: (1) a plurality of intake openings each comprising a controllable intake vent 205 for admitting ambient air into the data center building 101, and (2) a plurality of outlet openings each comprising a controllable outlet vent 203 for exhausting air out of the data center building 101. In step X15, the method comprises forming outside the building envelope 103 exhaust conduits 201 for receiving warm air from two controllable outlet vents 203 of each of the levels 102. Each exhaust conduit 201 has four sides, one formed by cowling 202 and the other three by exterior walls of the building envelope 103.

Whilst the present invention has been described and illustrated with reference to particular embodiments, it will be appreciated by those of ordinary skill in the art that the invention lends itself to many different variations not specifically illustrated herein Where in the foregoing description, integers or elements are mentioned which have known, obvious or foreseeable equivalents, then such equivalents are herein incorporated as if individually set forth. Reference should be made to the claims for determining the true scope of the present invention, which should be construed so as to encompass any such equivalents. It will also be appreciated by the reader that integers or features of the invention that are described as preferable, advantageous, convenient or the like are optional and do not limit the scope of the independent claims. Moreover, it is to be understood that such optional integers or features, whilst of possible benefit in some embodiments of the invention, may not be desirable, and may therefore be absent, in other embodiments.

The invention claimed is:

1. A multi-level data center building having a building envelope, wherein the data center building comprises a plurality of data levels;

wherein each data level accommodates:

at least twenty rack storage areas positioned on a floor, each rack storage area being arranged to accommodate a row of at least ten server racks each capable of accommodating at least twenty servers, the rack storage areas separating alternating hot aisles and cold aisles;

a plurality of air handling units for supplying cooling air to the servers via the cold aisles, each air handling unit comprising an adiabatic cooling unit;

a cold air supply corridor for transporting cold air from the air handling units to the cold aisles and for providing personnel access to the cold aisles, the cold air supply corridor being in fluid communication with the cold aisles through openings arranged along a first side of the cold air supply corridor;

a warm air return path for transporting warm air from the hot aisles to the air handling units;

wherein the plurality of air handing units are positioned along a second side of the cold air supply corridor opposite the first side;

wherein the rack storage areas, cold aisles, hot aisles, cold air supply corridor, warm air return path, and the air handling units are positioned within the building envelope;

wherein the building envelope comprises on each data level:

a plurality of controllable intake vents for admitting ambient air into the data center building, wherein each controllable intake vent is in fluid communication with an air handling unit, and wherein each air handling unit is in fluid communication with at least one intake vent; and a plurality of controllable outlet vents for exhausting air out of the data center building, wherein each controllable outlet vent is in fluid communication with the warm air return path; and an exhaust conduit for receiving warm air from at least one controllable outlet vent of each of at least two data levels.

2. The multi-level data center according to claim 1, wherein each air handling unit has a first end for receiving air to be treated and a second end for discharging treated air, the first end being opposed to the second end and the adiabatic cooling unit being positioned between the first end and the second end, wherein the second end is positioned at the second side of the cold air supply corridor, and wherein the first end is positioned at or adjacent the building envelope.

3. The multi-level data center building according to claim 1, wherein each data level comprises a plurality of controllable recirculation vents for controlling admission of warm air from the warm air return path to the air handling units.

4. The multi-level data center building according to claim 1, wherein the building envelope has a plurality of sides, wherein each controllable inlet vent is located on a side that is free from controllable outlet vents.

5. The multi-level data center building according to claim 1, wherein the exhaust conduit has at least two sides comprising a first side formed by the building envelope and a second side formed by a cowling.

6. The multi-level data center building according to claim 5, wherein the exhaust conduit comprises a third side formed by the building envelope, and wherein the first and third sides each comprise a controllable outlet vent at each level.

7. The multi-level data center building according to claim 1, comprising a plurality of enclosed air handler servicing passageways located within the building envelope, each enclosed air handler servicing passageway providing personnel access to a side of an air handling unit.

8. The multi-level data center building according to claim 7, wherein all serviceable components of each air handling unit are accessible via one or more of the air handler service passageways.

9. The multi-level data center building according to claim 1, wherein the warm air return space is a warm air plenum that extends above: the cold aisles, the cold air supply corridor and the air handling units.

10. The multi-level data center building according to claim 1, comprising at least four data levels.

11. The multi-level data center building according to claim 1, comprising a plurality of server racks located in the rack storage areas, each server rack accommodating at least 20 servers.

12. A method of cooling servers in the multi-level data center building according to claim 11, wherein the method comprises operating the air handling unit to provide cooling air for cooling the servers, wherein the method comprises:

transporting cooling air along an airflow path leading from the air handling units to the servers via the cold air supply corridor and the cold aisles and from the servers to the air handling units via the warm area, wherein the airflow path is located within the building; and, expelling air from multiple levels of the building into an exhaust conduit located outside the building, wherein the exhaust conduit conveys exhausted air upwards to or near the roof of the building.

13. The multi-level data center building according to claim 4, wherein adjacent sides comprising controllable inlet and outlet vents meet at a corner.

14. The multi-level data center building according to claim 6, wherein the exhaust conduit comprises a fourth side formed by the building envelope, the fourth side being opposed to the second side and the first side being opposed to the third side.

15. The multi-level data center building according to claim 9, wherein the warm air plenum is segregated from the cold aisles and the cold air supply corridor by a plurality of air entrainment panels suspended from a ceiling structure.

16. The multi-level data center building according to claim 10, comprising at least five data levels.

17. A method of making a multi-level data center building comprising a building envelope and a plurality of data levels, the method comprising:

creating each data level by defining on a floor of a building:

at least twenty rack storage areas, each rack storage area being arranged to accommodate a row of at least ten server racks each capable of accommodating at least twenty servers, the rack storage areas separating alternating hot aisles and cold aisles; and, a cold air supply corridor for transporting cold air from air handling units to the cold aisles and for providing personnel access to the cold aisles, the cold air supply corridor being in fluid communication with the cold aisles through openings arranged along a first side of the cold air supply corridor;

installing on each floor a plurality of air handling units for supplying cooling air to the servers via the cold aisles, each air handling unit comprising an adiabatic cooling unit;

forming within each data level a warm air return path for transporting warm air from the hot aisles to the air handling units;

forming in the building envelope at each data level:

a plurality of intake openings each comprising a controllable intake vent for admitting ambient air into the data center building, wherein each controllable intake vent is in fluid communication with an air handling unit, and wherein each air handling unit is in fluid communication with at least one intake vent; and a plurality of outlet openings each comprising a controllable outlet vent for exhausting air out of the data center building, wherein each controllable outlet vent is in fluid communication with the warm air return path;

and forming outside the building envelope an exhaust conduit for receiving warm air from at least one controllable outlet vent of each of the plurality of levels;

wherein the rack storage areas, cold aisles, hot aisles, cold air supply corridor, warm air return path, and the air handling units are positioned within the building envelope.

18. The method according to claim 17, wherein the exhaust conduit has at least two sides comprising a first side formed by one exterior wall of the building and a second side formed by a cowling;

optionally wherein the exhaust conduit comprises a third side formed by another exterior wall of the building, and wherein the first and third sides each comprise a controllable outlet vent at each level, and optionally wherein the exhaust conduit comprises a fourth side formed by a further exterior wall of the building, the fourth side being opposed to the second side and the first side being opposed to the third side.

19. The method according to claim 17, wherein the multi-level data center building is a multi-level data center building having a building envelope, wherein the data center building comprises a plurality of data levels;

wherein each data level accommodates:

at least twenty rack storage areas positioned on a floor, each rack storage area being arranged to accommodate a row of at least ten server racks each capable of accommodating at least twenty servers, the rack storage areas separating alternating hot aisles and cold aisles;

a plurality of air handling units for supplying cooling air to the servers via the cold aisles, each air handling unit comprising an adiabatic cooling unit;

a cold air supply corridor for transporting cold air from the air handling units to the cold aisles and for providing personnel access to the cold aisles, the cold air supply corridor being in fluid communication with the cold aisles through openings arranged along a first side of the cold air supply corridor;

a warm air return path for transporting warm air from the hot aisles to the air handling units;

wherein the plurality of air handing units are positioned along a second side of the cold air supply corridor opposite the first side;

wherein the rack storage areas, cold aisles, hot aisles, cold air supply corridor, warm air return path, and the air handling units are positioned within the building envelope;

wherein the building envelope comprises on each data level;

a plurality of controllable intake vents for admitting ambient air into the data center building, wherein each controllable intake vent is in fluid communication with an air handling unit, and wherein each air handling unit is in fluid communication with at least one intake vent; and a plurality of controllable outlet vents for exhausting air out of the data center building, wherein each controllable outlet vent is in fluid communication with the warm air return path; and an exhaust conduit for receiving warm air from at least one controllable outlet vent of each of at least two data levels.

20. The method according to claim 18, wherein the exhaust conduit comprises a third side formed by another exterior wall of the building, and wherein the first and third sides each comprise a controllable outlet vent at each level, and optionally wherein the exhaust conduit comprises a fourth side formed by a further exterior wall of the building, the fourth side being opposed to the second side and the first side being opposed to the third side.

* * * * *